United States Patent [19]

Alphonse et al.

[11] Patent Number: 4,821,277

[45] Date of Patent: Apr. 11, 1989

[54] SUPER-LUMINESCENT DIODE

[75] Inventors: Gerard A. Alphonse, Princeton, N.J.; Dean B. Gilbert, Yardley, Pa.

[73] Assignee: General Electric Company, Schenectady, N.Y.

[21] Appl. No.: 40,977

[22] Filed: Apr. 20, 1987

[51] Int. Cl.$^4$ .............................................. A01S 3/19
[52] U.S. Cl. ...................................... 372/45; 357/17; 372/46
[58] Field of Search ....................... 372/46, 45; 357/17

[56] References Cited

U.S. PATENT DOCUMENTS

| | | | |
|---|---|---|---|
| 4,251,780 | 2/1981 | Scifres et al. | 331/94.5 |
| 4,323,856 | 4/1982 | de Waard | 372/46 |
| 4,432,091 | 2/1984 | Kuroda et al. | 372/45 |

FOREIGN PATENT DOCUMENTS 0141282 8/1984 Japan.

OTHER PUBLICATIONS

I. Ladany et al., "Scandium Oxide Antireflection Coatings For Superluminescent LEDs" *Applied Optics*, vol. 25, No. 4, Feb. 15, 1986, pp. 472–473.
D. R. Scifres et al., "GaAs/GaAlAs Diode Lasers With Angled Pumping Stripes," *IEEE Journal of Quantum Electronics*, vol. QE-14, No. 4, Apr. 1978, pp. 223–227.
W. Heitmann, "Reactivity Evaporated Films Of Scandia and Yttria," *Applied Optics*, vol. 12, No. 2, Feb. 1973, pp. 394–397.
D. R. Kaplan et al., "Exact Calculation Of The Reflection Coefficient For Coated Optical Waveguide Devices," AT&T Bell Laboratories Technical Journal, vol. 63, No. 6, Jul.-Aug. 1984, pp. 857–877.
M. B. Holbrook et al., "External Cavity Operated Angled-Stripe Geometry DH Lasers," *Applied Physics Letter* 36 (5), Mar. 1, 1980, pp. 349–350.
G. A. Alphonse, "Superluminescent Diode Development," May 1986.
N. K. Dutta et al., "Optical Properties of a GaAlAs Superluminescent Diode," *IEEE Journal Of Quantum Electronics*, vol. QE-19, No. 4, Apr. 1983, pp. 496–498.
I. P. Kaminow et al., "Measurement of the Modal Reflectivity Of An Antireflection Coating On A Superluminescent Diode," *IEEE Journal Of Quantum Electronics*, vol. QE-19, No. 4, Apr. 1983, pp. 493–495.
L. N. Kurbatov, "Investigation Of Superluminescence Emitted By A Gallium Arsenide Diode," Soviet Physics–Semiconductors, vol. 4, No. 11, May 1971, pp. 1739–1744.
G. A. Alphonse et al., "High-Power Superluminescent Diodes," OSC Conference, Jan. 19–21, 1987.
J. Nieson et al., "High Power 0.83 $\mu$m Angle Stripe Superluminescent Diode," Southwest Optics Conference, Feb. 1987.

*Primary Examiner*—William L. Sikes
*Assistant Examiner*—Georgia Y. Epps
*Attorney, Agent, or Firm*—William Squire; James C. Davis, Jr.; Paul R. Webb, II

[57] ABSTRACT

A low coherence light emitting device comprises a semiconductor body with pair of opposed end faces. The device contains a current confining structure which forms an effective optical beam path between the end faces. The current confining structure is inclined at an angle relative to the direction perpendicular to at least one of the end faces. The tangent of this angle is greater than or equal to the effective optical beam path divided by the length of the body between the end faces. The structure thereby forms a device in which off-axis reflection is obtained at at least one of the device's end faces.

9 Claims, 1 Drawing Sheet

SUPER-LUMINESCENT DIODE

The government has rights in this invention pursuant to a goverment contract.

The invention relates to a super-luminescent diode having a radiation confining region whose axis of symmetry is nonperpendicular to one of the diode's end faces. Of interest are copending applications Ser. No. 040,976 entitled "Optical Coupling System" by Minora Toda et al., Ser. No. 040,979 entitled "Super Luminescent Diode" by G. A. Alphonse et al., and Ser. No. 040,978 entitled "Low Coherence Optical System Having Reflective Means" by G. A. Alphonse all filed concurrently herewith and assigned to the assignee of the present invention.

BACKGROUND OF THE INVENTION

High power radiation emitting devices, such as semiconductor lasers, typically comprise a body of semiconductor material having opposed end faces in which an active layer is positioned between two cladding regions of opposite conductivity. Gain, which is necessary for these high power devices, results from a population inversion which occurs when applied current is increased. The end faces of the body form a resonant cavity such that radiation generated in the active layer is partially reflected back into the semiconductor body by an end face toward the opposing end face. When the current is sufficiently increased above some threshhold value the increase in gain causes lasing action to occur. Lasers emit a narrow band of highly coherent radiation having a coherence length of approximately 2 centimeters(cm). Coherent radiation, or radiation having a high spectral modulation, is undesirable in some applications, such as fiber optic gyroscopes, which require high power devices which emit radiation having low coherence. Other devices such as light emitting diodes (LED's) emit a broad band of radiation but operate at low power, insufficient for high power applications.

Super-luminescent diodes (SLDs) provide a high power output of broad band low coherent radiation, that being radiation having a coherence length of less than about 200 micrometers ($\mu$m) and typically about 50 $\mu$m. An SLD typically has a structure similar to that of a laser, with lasing being prevented by antireflection coating formed on the end faces. These coatings must reduce the reflectivity of the end faces to about $10^{-5}$ or less to prevent lasing in a high power SLD and further, this reflectivity must be reduced to about $10^{-6}$ to achieve low spectral modulation. Spectral modulation is the percentage ratio of the difference between the maximum and minimum power output divided by the sum of the maximum and minimum power output and low spectral modulation is 5% or less modulation. Unfortunately, low reflectivity of about $10^{-6}$ at the end faces is difficult to obtain consistently for a given output wavelength and even a slight temperature change which alters the output wavelength will change the reflectivity, thus making the manufacture of low spectral modulation SLDs extremely difficult.

Other SLD structures utilize a stripe interrupt geometry in which a metallized stripe is formed over a portion of an active region. This stripe extends from one end face towards but not up to the opposing end face. During device operation of these SLDs a reflecting interface is formed under the end of the metallized stripe which does not extend to the opposing end face. This interface is formed due to differences in propagation characteristics in the active region, where current is not supplied by the metallized stripe and results in high spectral modulation even at moderate power levels.

Due to the aforementioned problems, an SLD has been limited to a maximum output power of about 7 mw continuous wave (cw) and has had high spectral modulation, typically 50% at maximum power and 20% at half power. Thus, it would be desirable to have an alternative construction for SLDs and method for making same.

SUMMARY OF THE INVENTION

A low coherence light emitting device comprises a body having a pair of end faces. The device contains a current confining structure therein such as to form an effective optical beam path between the end faces. The axis of symmetry of the structure is formed at an angle relative to the direction perpendicular to at least one of the end faces and the tangent of the angle is greater than or equal to the width of the effective optical beam path divided by the length of the body between the end faces.

DETAILED DESCRIPTION OF PREFERRED EMBODIMENTS

Figure 1:
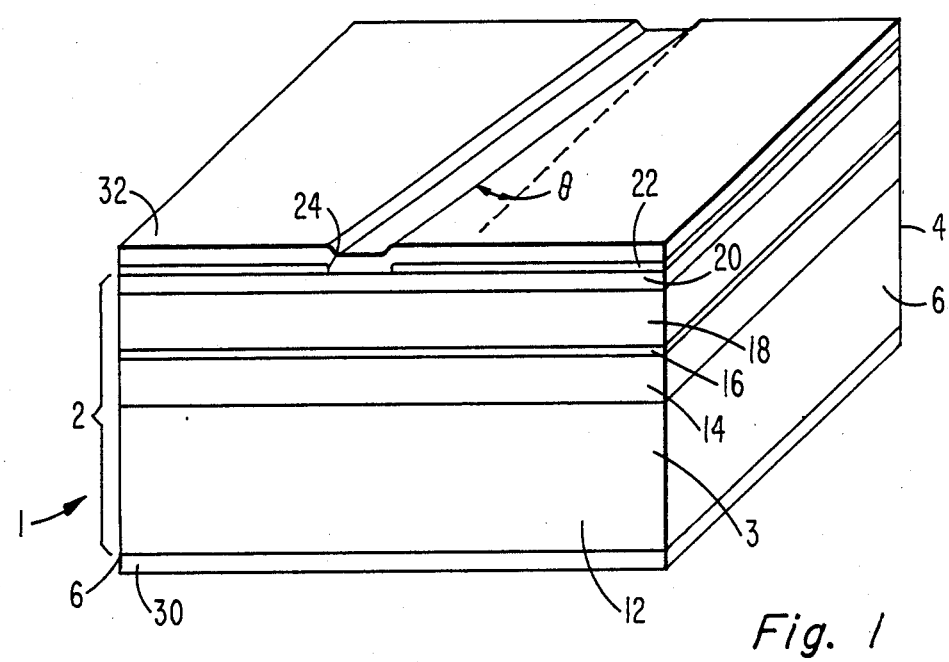
FIG. 1 is a perspective view of a light emitting device of the invention.

As shown in FIG. 1, a light-emitting device 1 comprises a body 2 having first and second opposed end faces 3 and 4, respectively, and sidewalls 6 extending therebetween. The body 2 includes a substrate 12 having a first cladding layer 14 thereon, an active layer 16 overlying the first cladding layer 14, a second cladding layer 18 overlying the active layer 16, and a capping layer 20 overlying the second cladding layer 18. An electrically insulating layer 22, having an aperture 24 therethrough which extends between the end faces 3 and 4, respectively, and which is nonperpendicular relative to the first and second end faces 3 and 4, respectively, overlies the capping layer 20. A means for electrically contacting the body 2 comprises a first electrical contact 30 which overlies the surface of the substrate 12 opposite the first cladding layer 14 and a second electrical contact 32 which overlies the capping layer 20 in the aperture 24 and insulating layer 22.

The substrate 12, first cladding layer 14, and capping layer 20 are of one conductivity type and the second cladding layer 18 is of the opposite conductivity type. The refractive index of the active layer 16 should be greater than the refractive index of both the first and second cladding layers 14 and 18, respectively. The body is typically composed of binary group III–V compounds such as GaAs and alloys of such compounds.

The substrate 12 is typically composed of N-type GaAs about 100 micrometers ($\mu$m) thick and has a first major surface parallel to or slightly misoriented from the (100) crystallographic plane. The first cladding layer 14 typically combines the functions of a buffer layer and a cladding layer. The first and second cladding layers 14 and 18 respectively, are about 1.5 $\mu$m thick and are typically composed of $Al_xGa_{1-x}As$ where x is generally between about 0.3 and 0.4 and typically about 0.4. The active layer 16 is typically about 0.08 μm thick and is generally composed of $Al_xGa_{1-x}As$ where x is between about 0 and 0.1, depending on the wavelength to be emitted. The capping layer 20 is typically about 0.5 μm thick and is typically composed of N-type GaAs with zinc diffused therethrough in the region of the aperture 24. The insulating layer 22 is typically about 0.01 μm thick and is preferably composed of silicon oxide deposited by pyrolytic decomposition of a silicon-containing gas, such as silane, in oxygen or water vapor.

The aperture 24, which is non-perpendicular relative to at least one end face and typically both end faces, provides a means for defining an effective optical beam path within the device which is the gain region. Typically the means is a current confining structure, such as the second electrical contact 32 in the aperture 24, which is in the shape of a linear stripe about 5 μm wide in the lateral direction, that being the direction perpendicular to the planes of the sidewalls 6. Preferably, an additional current confining structure is formed such as by employing the capping layer 20 to form a current blocking layer. The current confining structure extends between the pair of opposed parallel end faces, 3 and 4 respectively, and has an axis of symmetry which is at an angle $\theta$ relative to the direction perpendicular to the end faces. The tangent of the angle $\theta$ must be greater than or equal to the effective width of the optical beam path in the device divided by the length of the body between the first and second end faces 3 and 4, respectively. This minimizes the Fabry-Perot reflections which occur in a laser cavity due to reflections occurring between the end faces 3 and 4 respectively. It should be understood that the effective width of the optical beam in the device 1 is not the width of the aperture 24 since the effective width of the optical beam will extend on each side of the aperture 24. If merely the width of the structure is relied upon as the effective width of the optical beam, then an unacceptable high modulation output will be emitted. For example, an SLD was formed with $\theta$ being about 5°. The device had a 5 μm width stripe and was about 200 μm in length. In this case, the tangent of the angle $\theta$ was about 0.087 and was much greater than the width of the stripe divided by the length of the body. However, a high modulation output of about 30% was emitted in this device. Further tests revealed that this device had an effective beam path width of about 40 μm. Therefore, the tangent of the angle $\theta$ was less than the effective width of the optical path divided by the length of the body and was thereby insufficient to adequately reduce the Fabry-Perot feedback in the gain region. Thus, additional samples were formed with reduced optical beam path widths such as by using blocking layers, and the samples were tested to determine that the tangent of the chosen angle $\theta$ was greater than the width of the optical path divided by the length of the body. After these tests, if necessary, additional current confinement could be provided, the angle $\theta$ increased, or the length of the body increased to insure that the tangent of the angle $\theta$ was of a sufficient value.

The width of the effective optical beam path is typically determined by obtaining an intensity beam profile by attaching a camera and a linear array of detectors to a microscope. The camera provides a direct view of the emitting facet and the output of the detectors provides an intensity beam profile. Alternatively, a vidicon camera in which a charge density pattern is formed on a photoconductor may be scanned with an electron beam in a single line to obtain the intensity beam profile. Typically, the beam width is determined by the half width of the beam profile. Alternatively, the $2\sigma$ or $3\sigma$ widths of the profile may be used to further reduce any possible feedback.

The angle $\theta$ must have a value such that $2\theta$ exceeds the critical value for lateral reflection, that being the angle at which there is no refracted ray and thereby total internal reflection exists. For example, the active layer 16 has differences in its effective refractive index between that portion of the active layer 16 containing the optical beam path and the remaining portion of the active layer. These differences in refractive index serve as boundaries which confine radiation within the optical beam path of the device, providing total internal reflection and thereby resulting in high spectral modulation. Therefore, the angle $2\theta$ must be greater than the critical angle to prevent reflections in the optical beam path at these boundaries. The critical angle $\theta_c$ is determined as follows:

$$\theta_c = Sin^{-1}[1-(n_2/n_1)^2]^{\frac{1}{2}}$$

where $n_1$ is the effective refractive index of the active layer 16 containing the optical beam and is typically about 3.355 for AlGaAs and $n_2$ is the effective refractive index of the remaining portion of the active layer and is typically about 3.35 for AlGaAs. Therefore, $\theta_c$ is typically about 3.13°/2 and the angle $\theta$ must be greater than 3.13°/2 and is chosen to be about 5° to account for diffraction spread. The angle $\theta$ may be about equal to the Brewster angle which is equal to the inverse tangent of the refractive index of the medium adjacent the first end face 3, divided by the transverse effective refractive index for light propagating between the end faces. The medium adjacent the first end face 3 is typically air having a refractive index of about 1 and the refractive index of the body 2 is typically 3.35 for GaAs devices. Thus, the Brewster angle is typically about 16.6°. At the Brewster angle the radiation vibrating in the plane of incidence is not reflected, thus resulting in radiation which is predominantly polarized. Further, at this angle the reflected and refracted rays are 90° apart resulting in a non-reflective condition at the emitting end face. This condition allows the elimination of antireflection coatings on the devices' end faces which are typically used to increase output.

Figure 2:
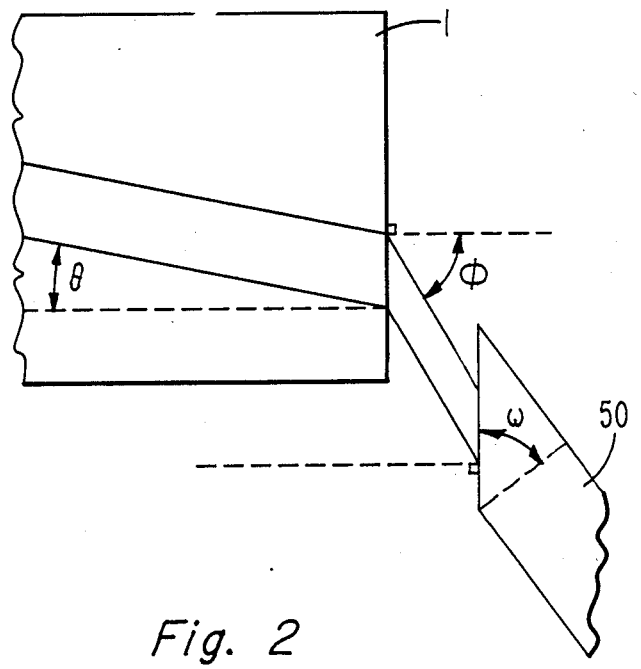
FIG. 2 is a top view of an optical system for coupling radiation from the light emitting device of the present invention into an optical fiber.

Typically, the emitted radiation will be nonperpendicular relative to the first end face 3 having an output angle $\phi$ determined by:

$$\phi = Sin^{-1}\frac{n_1 Sin\,\theta}{n_2}$$

Where $n_1$, is the transverse effective refractive index of the device 1 and $n_2$ is the refractive index of the medium adjacent the first end face. For example, as shown in FIG. 2, a GaAs device 1 in air having an angle $\theta$ of 16.6° will emit radiation at an output angle $\phi$ of about 73.3° relative to the longitudinal direction. Optical coupling from the device 1 to a receiving device such as an optical fiber 50 may be obtained by inclining the fiber's end face 54 such that it is nonperpendicular relative to the fiber's axis and radiation propagates along the fiber's axis such as disclosed by Minoru Toda in a copending U.S. patent application Ser. No. 040,976. Further, a reflective coating is preferably positioned adjacent the second end face 4 to provide a means for redirecting a portion of the radiation back into the device such as disclosed by Gerard A. Alphonse in copending U.S. application Ser. No. 040,979 entitled "Low Coherence Optical System Having Reflective Means." This embodiment will provide greatly increased radiation from the first end face 3 since the device 1 may be modeled as an amplifier in which the output is related to an exponential function of the length of the optical beam path and a function of the current density in the device 1. Thus, the reflected radiation from the second end face 4 when redirected into the active layer 16, will be reamplified exponentially resulting in increased radiation from the first end face 3.

The body 2 may be fabricated using liquid-phase epitaxy techniques to deposit the layers. Suitable liquid-phase epitaxy techniques have been disclosed by Nelson in U.S. Pat. No. 3,565,702 and Lockwood et al. in U.S. Pat. No. 3,753,801, both incorporated herein by reference. The aperture 24 is formed in the silicon oxide insulating layer 22 by first forming a photoresist layer having an angled stripe aperture therein, over the insulating layer 22 which is then etched by a suitable etchant such as buffered hydrofluoric acid.

It should be noted that current confining structures may be formed by other means, for example, ridge guide structures may be formed in which an active layer or a waveguide layer provide the current confining structure of the present invention.

The first electrical contact 30 is preferably composed of sequentially deposited germanium, gold, nickel, and gold layers. The second electrical contact 32 is preferably composed of titanium, platinum and gold layers which are sequentially deposited onto a zinc or cadmium diffused surface.

In the operation of the device 1 a bias voltage of the proper polarity is applied to the electrical contacts 30 and 32 respectively, producing light emission in the active region. The aperture 24 provides a means for reducing on-axis reflections of light between the end faces resulting in an emission having low coherence. These devices have consistently provided 14 mw of power virtually free of modulation, cw, and up to 28 mw with only 5% spectral modulation. Thus, these devices have better performance characteristics than previous devices which could operate at only one-fourth the output power.

We claim:

1. In a super luminescent gain guided light emitting device which includes:
a semiconductor body having spaced first and second opposed end faces with an active region extending therebetween, said end faces being spaced apart a given distance at said active region, said device having a first current confining structure comprising a linear strip of material adjacent to a side of said active region, said structure being arranged to form an effective optical beam path between the end faces at said active region, said beam path having an optical axis of symmetry determined by and parallel to said current confining structure, said path being oriented so that said axis of symmetry intersects said end faces, said path having a given width transverse said optical axis, wherein the improvement comprises:
the optical axis of symmetry is inclined at an angle and non-parallel relative to a direction perpendicular to at lest one of said end faces, the tangent of said angle being greater than or equal to the width of said effective optical beam path divided by said given distance;
said angle has a value such that light parallel to said axis incident on said at least one end face and reflected from that one end face toward said beam path is caused to be substantially refracted out of the beam path when incident on the boundary between the effective optical beam path and the adjacent semiconductor body outside the beam path;
the values of said tangent and angle being such that together said values tend to minimize the spectral modulation within said path.

2. The device of claim 1 wherein said angle is about equal to the Brewster angle.

3. The device of claim 1 further comprising a second current confining structure secured to and adjacent to said first current confining structure wherein said second structure comprises a strip of material inclined at said angle relative to the direction perpendicular to said at least one end face.

4. The device of claim 1 wherein said linear strip of material comprises a metallized layer which contacts said body through an aperture in an insulating layer on said body.

5. The device of claim 1 wherein said current confining structure comprises a blocking layer having a current blocking portion and a current passing portion forming an effective current passing opening therein.

6. The device of claim 1 wherein the width of the optical beam path is about equal to the half width of the intensity beam profile.

7. The device of claim 1 wherein said angle is greater than about 3.13°.

8. The device of claim 1 wherein said angle is about 5°.

9. The device of claim 1 wherein said linear strip has a width corresponding to said transverse path width of about 5 μm.

* * * * *